(12) United States Patent
Sheik-Bahae et al.

(10) Patent No.: US 11,949,211 B2
(45) Date of Patent: Apr. 2, 2024

(54) BROADBAND ACTIVE MIRROR ARCHITECTURE FOR HIGH POWER OPTICALLY PUMPED SEMICONDUCTOR DISK LASERS

(71) Applicant: UNM RAINFOREST INNOVATIONS, Albuquerque, NM (US)

(72) Inventors: Mansoor Sheik-Bahae, Albuquerque, NM (US); Alexander Robert Albrecht, Albuquerque, NM (US); Zhou Yang, Albuquerque, NM (US)

( * ) Notice: Subject to any disclaimer, the term of this patent is extended or adjusted under 35 U.S.C. 154(b) by 521 days.

(21) Appl. No.: 17/277,669

(22) PCT Filed: Sep. 19, 2019

(86) PCT No.: PCT/US2019/051987
§ 371 (c)(1),
(2) Date: Mar. 18, 2021

(87) PCT Pub. No.: WO2020/061351
PCT Pub. Date: Mar. 26, 2020

(65) Prior Publication Data
US 2021/0351564 A1 Nov. 11, 2021

Related U.S. Application Data

(60) Provisional application No. 62/733,466, filed on Sep. 19, 2018.

(51) Int. Cl.
*H01S 5/024* (2006.01)
*H01S 5/02355* (2021.01)
(Continued)

(52) U.S. Cl.
CPC ...... *H01S 5/02469* (2013.01); *H01S 5/02484* (2013.01); *H01S 5/041* (2013.01);
(Continued)

(58) Field of Classification Search
CPC ............ H01S 5/02469; H01S 5/02484; H01S 5/18–187; H01S 5/02476–02492; H01S 5/023–02326; H01S 5/041
See application file for complete search history.

(56) References Cited

U.S. PATENT DOCUMENTS 6,661,830 B1 * 12/2003 Reed ................... H01S 5/18386
372/99
6,680,799 B1 * 1/2004 Parriaux ............... H01S 3/0604
359/569

(Continued)

FOREIGN PATENT DOCUMENTS

DE 102013204964 A1 * 9/2013 ............. B82Y 20/00
WO WO-2006136346 A1 * 12/2006 ............. B82Y 20/00

OTHER PUBLICATIONS

Extended European Search Report dated May 19, 2022 in corresponding European Application No. 19863319.0, 13 pages.

(Continued)

*Primary Examiner* — Joshua King
(74) *Attorney, Agent, or Firm* — MH2 TECHNOLOGY LAW GROUP LLP (57) ABSTRACT

A vertical-external-cavity surface-emitting laser (VECSEL) and a method of forming the VECSEL is disclosed. The VECSEL includes a heat sink; a heat spreader or heat spreader formed on a top surface of the heat sink, where the heat spreader comprises a first material having a first refractive index; and a high contrast grating formed on a top surface of the heat spreader or active region, wherein the high contrast grating comprises an active region and the high contrast grating comprising a second material having a second refractive index, the second refractive index is greater than the first refractive index.

19 Claims, 9 Drawing Sheets

(51) Int. Cl.
*H01S 5/04* (2006.01)
*H01S 5/183* (2006.01)
*H01S 5/30* (2006.01)

(52) U.S. Cl.
CPC ...... *H01S 5/18361* (2013.01); *H01S 5/18386* (2013.01); *H01S 5/3013* (2013.01); *H01S 5/02355* (2021.01); *H01S 5/1838* (2013.01)

(56) References Cited

U.S. PATENT DOCUMENTS

| | | | | |
|---|---|---|---|---|
| 7,778,305 | B2* | 8/2010 | Parriaux | H01S 3/08059 372/98 |
| 9,112,331 | B2* | 8/2015 | Northrup | B82Y 20/00 |
| 10,305,248 | B2* | 5/2019 | Mathai | H01S 5/18363 |
| 2005/0030540 | A1* | 2/2005 | Thornton | H01S 3/067 356/432 |
| 2005/0190810 | A1* | 9/2005 | Butterworth | H01S 5/02484 372/99 |
| 2006/0251140 | A1* | 11/2006 | Lee | H01S 5/024 372/99 |
| 2006/0280219 | A1* | 12/2006 | Shchegrov | G03B 21/204 372/99 |
| 2008/0019406 | A1* | 1/2008 | Abram | H01S 5/141 372/36 |
| 2011/0064099 | A1* | 3/2011 | Govorkov | H01S 5/0217 372/36 |
| 2012/0128019 | A1* | 5/2012 | Chang-Hasnain | H01S 5/423 372/45.01 |
| 2012/0257647 | A1* | 10/2012 | Shu | H01S 5/183 372/36 |
| 2012/0269216 | A1* | 10/2012 | Govorkov | B82Y 20/00 372/45.01 |
| 2013/0028279 | A1* | 1/2013 | Iakovlev | H01S 5/02484 372/36 |
| 2013/0058370 | A1* | 3/2013 | Chang-Hasnain | G02B 5/1861 359/572 |
| 2014/0376581 | A1* | 12/2014 | Stolzenburg | H01S 3/16 219/121.64 |
| 2017/0256904 | A1* | 9/2017 | Aspelmeyer | H01S 5/02469 |
| 2018/0006427 | A1* | 1/2018 | Sciancalepore | H01S 5/3013 |

OTHER PUBLICATIONS

Yang et al. "A Gain-Embedded Meta-Mirror," 2019 Conference on Lasers and Electro-Optics (CLEO), OSA, May 5, 2019, 2 pages.

Walczak et al. "Simulation of 1550 nm diamond VECSEL with high contrast grating," Proceedings of SPIE, Visual Communications and Imaging Processing 2005, vol. 8432, May 3, 2012, 9 pages.

Sciancalepore et al. "High-Contrast Gratings for Long-Wavelength Laser Integration on Silicon," Proceedings of SPIE, IEEE, US, vol. 8995, Feb. 19, 2014, 11 pages.

International Search Report and Written Opinion dated Mar. 19, 2020 in corresponding International Application No. PCT/US2019/051987, 6 pages.

* cited by examiner

BROADBAND ACTIVE MIRROR ARCHITECTURE FOR HIGH POWER OPTICALLY PUMPED SEMICONDUCTOR DISK LASERS

CROSS REFERENCE TO RELATED APPLICATIONS

This application is a U.S. National Phase application of PCT/US2019/051987 filed Sep. 19, 2019, which claims priority to U.S. Provisional Patent Application Ser. No. 62/733,466, filed Sep. 19, 2018, the entireties of which are incorporated herein by reference.

GOVERNMENT FUNDING

This invention was made with government support provided by the Air Force Office of Scientific Research under Grant No. FA9550-16-1-0362. The Government has certain rights in the invention.

FIELD

The present teachings generally relate to semiconductor lasers, and more particularly to high power continuous wave (CW) and multi kilo-watts output power operation of optically pumped semiconductor disk lasers.

BACKGROUND

Figure 1:
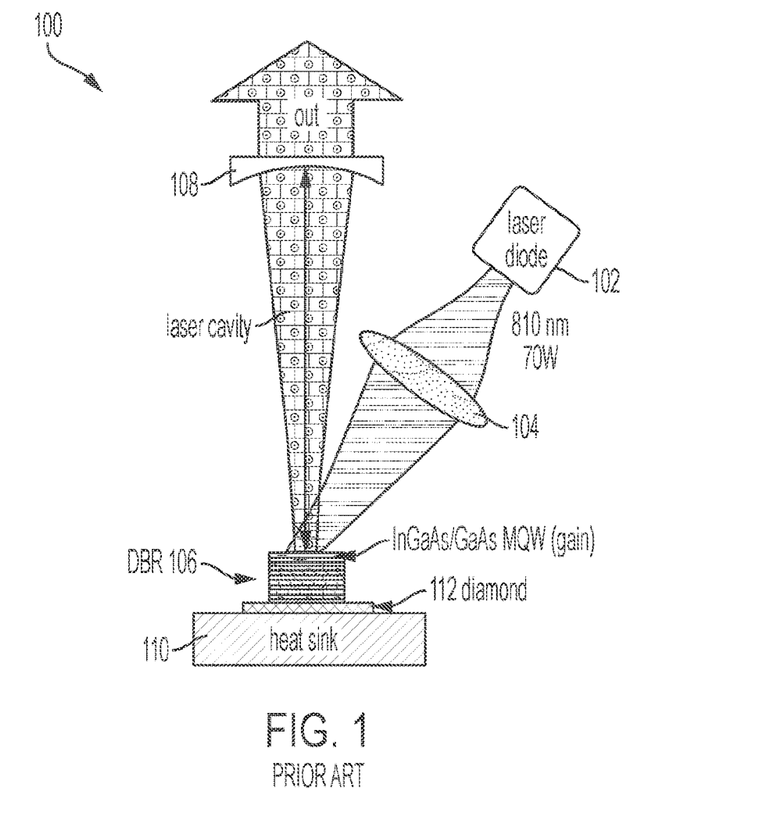
FIG. 1 shows a traditional high-power VECSEL setup.

Optically pumped semiconductor lasers (OPSLs), also referred to as vertical-external-cavity surface-emitting lasers (VECSELs), or semiconductor disk lasers (SDLs), have rapidly established themselves as high-power, good beam quality sources for a variety of applications. Unlike other solid state disk or fiber lasers, semiconductor lasers can be designed to operate over a large wavelength range, not easily accessible by other technologies. However, the output power of VECSELs has been limited to around 100 W, compared to several kW from fiber and disk lasers. One limiting factor of output power is thermal management. A VECSEL active mirror typically consist of a semiconductor active region—commonly quantum wells (QWs)—on top of a distributed Bragg reflector (DBR) inside an external cavity. FIG. 1 shows a setup of a traditional high-power VECSEL 100. VECSEL 100 comprises laser diode 102 producing a laser beam having a wavelength of, for example, 810 nm, and a power of, for example 70 W. Lens 104 directed the laser beam to pump the active/gain region, which sits on top of DBR 106. A laser cavity of the VECSEL 100 is defined by a distance from a top surface of the DBR 106 and external mirror 108. Heat from the active region is conducted away through DBR 106 to a heat spreader, which is typically composed of diamond, and to heat sink 110 that is coupled by coupling layer 112. DBR 106 is formed by alternating layers of high and low index of refraction semiconductors, often in excess of 20 pairs and 5 microns in total thickness, to reach the required reflectivity values. This thickness and large number of material interfaces causes a high thermal resistance in DBR 106, leading the active region to overheat, ultimately limiting the output power. Additional heat may also be generated in DBR 106 through absorption of pump power not absorbed in the active region.

Figure 2:
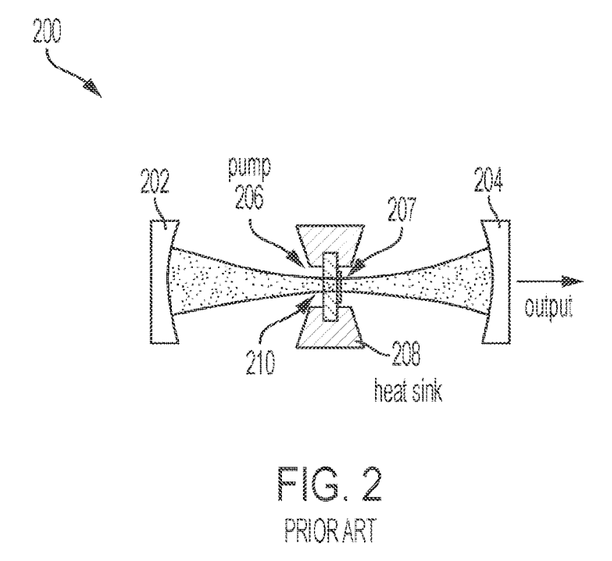
FIG. 2 shows a traditional DBR-free SDL setup.

FIG. 2 shows a setup of conventional DBR-free SDL 200. DBR-free SDL 200 comprises a laser cavity defined by mirror 202 and mirror 204. Pump laser 206 provides optical energy which is absorbed in active region 207 and heat sink 208 conducts heat away from DBR-free SDL 200. DBR-free SDLs remove the need for and the thermal limitations of the DBR. But due to their transmission geometry, they must rely on lateral heat transport in heat spreader 210, limiting their power scalability. Also, since heat spreader 210 is part of the laser cavity, it has to be of extremely high purity, to avoid excessive optical losses.

Figure 3:
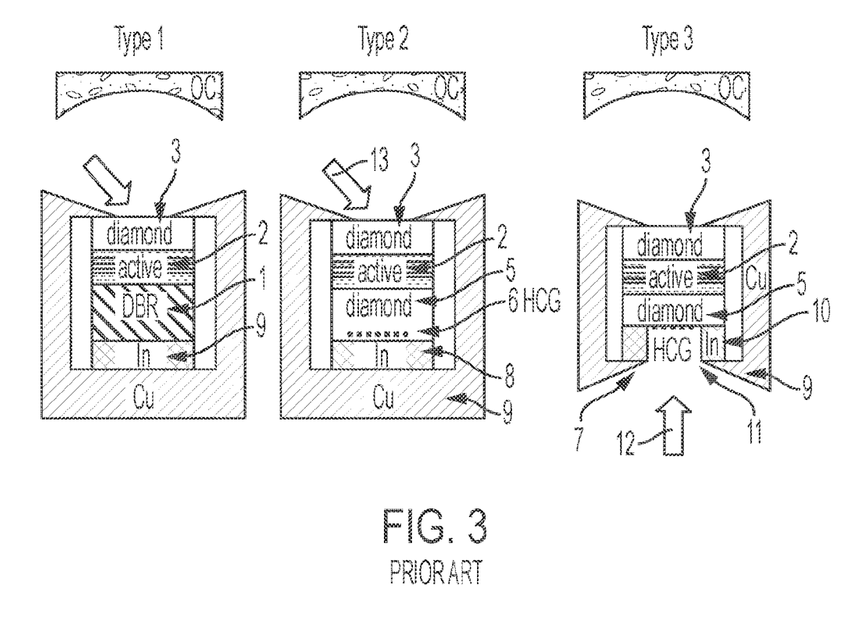
FIG. 3 shows traditional grating-based laser designs.

High Contrast Gratings (HCG) has been proposed to act as a highly reflective mirror using only a relatively thin layer of high-index material, which is patterned laterally, typically in a striped pattern. By controlling the grating and substrate materials (index of refraction, thickness), grating design (etch depth, periodicity, duty cycle), the reflectivity of the HCG can be tailored to perform a variety of tasks, including the use as laser mirrors. Such structures have been proposed and/or demonstrated for vertical-cavity surface-emitting lasers as well as VECSELs, where a silicon grating is deposited on top of a diamond heat spreader. FIG. 3 shows three lasers using HCG. Note, however, that in all cases the heat spreader is inside the laser cavity, causing similar concerns as mentioned above with regard to DBR-free SDLs. The HCG used in such laser devices are of so-called guided-mode resonance (GMR) type which has an extremely narrow bandwidth.

What is needed is an improved laser design that addresses the above-noted issues.

SUMMARY

In accordance with examples of the present disclosure, a vertical-external-cavity surface-emitting laser (VECSEL) is provided that comprises a heat sink; a heat spreader attached or bonded to a heat sink, where the heat spreader comprises a first material having a first refractive index; an active region attached or bonded to the heat spreader, wherein the active region comprises a second material (or combination of materials) having a second refractive index; and a high contrast grating formed in, or attached or bonded to a top surface of the active region, wherein the high contrast grating comprises a third material having a third refractive index, wherein the second refractive index is greater than the first refractive index. The high contrast grating can be formed in any material transparent to the laser and, in some examples, a pump wavelength.

In accordance with examples of the present disclosure, a method of forming a vertical-external-cavity surface-emitting laser (VECSEL) is provided. The method comprises bonding a heat spreader to a top surface of a heat sink, where the heat spreader comprises a first material having a first refractive index; bonding an active region to a top surface of the heat spreader, wherein the active region comprises a second material having a second refractive index; and bonding a high contrast grating on a top surface of the active region, wherein the high contrast grating comprises a third material having a third refractive index, wherein the second refractive index is greater than the first refractive index. The high contrast grating can be formed in any material transparent to the laser and, in some examples, a pump wavelength.

In some examples, the heat spreader is bonded to the heat sink using a thermal adhesive.

In some examples, the high contrast grating and active region is bonded to the heat spreader using Van der Waals bonding.

In some examples, the active region comprises a semiconductor active region. The active region can be surrounded by carrier confinement/window layers. The HCG can be fourned In some examples, the active region comprises a bulk semiconductor, heterostructure, one or more quantum wells, or one or more quantum dot layers.

In some examples, the active region comprises GaAs, AlGaAs, InGaAs, InP/AlInGaAs/InGaAs, GaSb/AlGaAsSb/InGaAsSb, or GaAs/AlAs/AlGaAs/GaInP/AlGaInP.

In some examples, a period, a fill factor, an etch depth, an index of refraction of the high contrast grating are optimized such that a zero-order diffraction from the high contrast grating is minimized and higher diffraction orders transmitted to allow for total internal reflection at an interface of the heat spreader.

In some examples, the heat spreader is diamond, silicon carbide, sapphire, or another high thermal conductivity, transparent material.

In some examples, the heat spreader is cooled via direct contact with a cooling medium or by attachment to a heat sink.

In some examples, the heat spreader is bonded to the heat sink using a thermal glue or solder (e.g. indium).

BRIEF DESCRIPTION OF THE DRAWINGS

The accompanying drawings, which are incorporated in, and constitute a part of this specification, illustrate implementations of the present teachings and, together with the description, serve to explain the principles of the disclosure. In the figures.

It should be noted that some details of the figures have been simplified and are drawn to facilitate understanding of the present teachings rather than to maintain strict structural accuracy, detail, and scale.

DETAILED DESCRIPTION

Examples of the present disclose describe a high-contrast-grating-based active mirror architecture that can deliver kilo-Watts level continuous-wave (CW) operation of optically-pumped semiconductor disk lasers. An optically pumped gain medium is sandwiched between a high fill-factor, high-contrast grating and a heat spreader (e.g. diamond, silicon carbide, or sapphire). The proximity of the gain medium to the heat-sunk heat spreader and the absence of distributed Bragg mirror (with high thermal resistance and parasitic absorption) allows improved heat-sinking and higher-power operation in the multi-kW regime.

Broadband HCG reflectors are used in an active geometry (with optically pumped gain). We have discovered an active HCG geometry that can be integrated with (or bonded to) a high index/high thermal conductivity heat spreader (diamond or SiC) that at last makes the long-sought goal of pushing VECSELs into the kW regime a reality. For brevity, we hereafter refer to these structures as "thermally-managed active grating" VECSELs or TAG-VECSELs.

Figure 9:
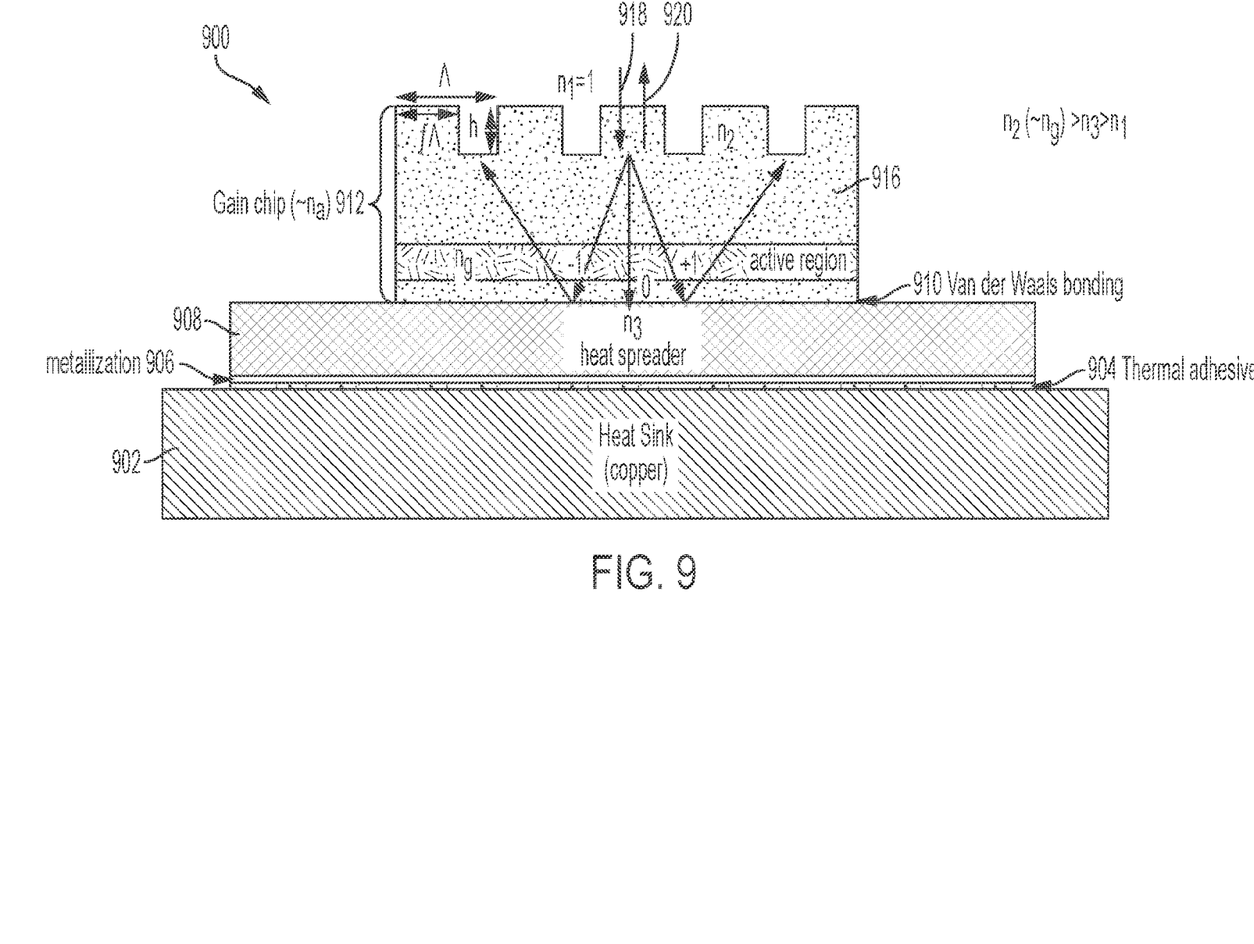
FIG. 9 shows an active mirror design with HCG integrated into semiconductor active region, according to examples of the present disclosure.

FIG. 9 shows an active mirror design for a broadband high-contrast grating 900, where the HCG is monolithically part of a gain chip or a semiconductor active region, according to examples of the present disclosure. In this example, an active mirror with HCG is etch into a top surface of the gain chip with the semiconductor active region. As shown in FIG. 9, broadband high-contrast grating 900 comprises heat sink 902 composed of an appropriate heat conducting material such as copper or other similar heat conducting materials. Broadband high-contrast grating 900 also comprises heat spreader 908 that is disposed on and bonded to a top surface of heat sink 902 by thermal adhesive 904 and metallization layer 906. Thermal adhesive 904 can be composed of thermally conductive epoxy. In some examples, heat sink 902 and heat spreader 908 are boded using a mechanical attachment, such as screws or bolts, and optionally using a heat sink compound or indium foil at the interface of heat sink 902 and heat spreader 908.

Heat spreader 908 is composed of a material that can include e.g. diamond, silicon carbide, sapphire, having a refractive index denoted by $n_3$. Broadband high-contrast grating 900 also comprises gain chip 912 which comprises a semiconductor active region that is disposed on and bonded to a top surface of heat spreader 908. In some examples, gain chip 912 or semiconductor active region is bonded to heat spreader 908 using Van der Waals bonds 910. In some examples, the semiconductor active region can comprise a bulk semiconductor, heterostructure, one or more quantum wells, or one or more quantum dot layers. In some examples, the semiconductor active region can comprise GaAs, AlGaAs, InGaAs, InP, AlInGaAs, InGaAs, GaSb, AlGaAsSb, InGaAsSb, or GaAs,AlAs, AlGaAs, GaInP, AlGaInP. The semiconductor active region is composed of a material having a refractive index denoted by $n_a$.

Broadband high-contrast grating 900 also comprises HGC 916 that is formed integrally by etching with gain chip 912. The HCG 916 can be formed in any material transparent to the laser and, in some examples, a pump wavelength. HCG 916 is composed of a material having a refractive index denoted by $n_2$. As shown in FIG. 9, incident radiation 918, as shown by downward directed arrow, is provided to broadband high-contrast grating 900 from an environment with a refractive index denoted by $n_1$, which is 1 for air, and output radiation 920 is shown by upward directed arrow. In the arrangement of FIG. 9, $n_2$ ($\sim n_a$)>$n_3$>$n_1$.

Figure 4:
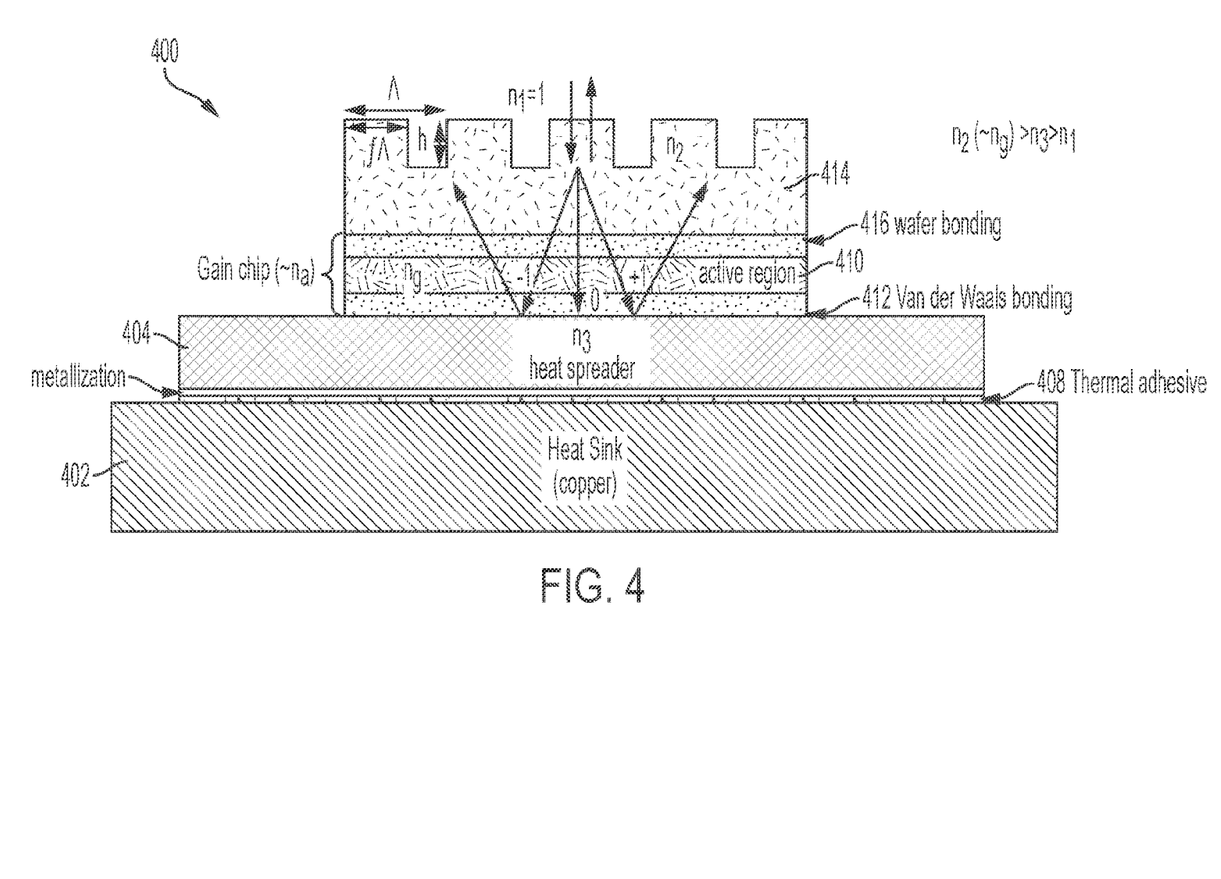
FIG. 4 shows an active mirror design with HCG integrated into semiconductor active region, where the HCG is formed separately and bonded to the gain chip, according to examples of the present disclosure.

FIG. 4 shows an active mirror design for a broadband high-contrast grating 400, where the HCG, where the HCG is formed separately and bonded to the gain chip, according to examples of the present disclosure. As shown in FIG. 4, broadband high-contrast grating 400 comprises heat sink 402 composed of an appropriate heat conducting material such as copper or other similar heat conducting materials. Broadband high-contrast grating 400 also comprises heat spreader 404 that is disposed on and bonded to a top surface of heat sink 402 by thermal adhesive 408 and metallization layer. Thermal adhesive 408 can be composed of thermally conductive epoxy. In some examples, heat sink 402 and heat spreader 404 are boded using a mechanical attachment, such as screws or bolts, and optionally using a heat sink compound or indium foil at the interface of heat sink 402 and heat spreader 404.

Heat spreader 404 is composed of a material that can include e.g. diamond, silicon carbide, sapphire, having a refractive index denoted by $n_3$. Broadband high-contrast grating 400 also comprises a gain chip that comprises a semiconductor active region 410 that is disposed on and bonded to a top surface of heat spreader 404. In some examples, the gain chip is bonded to heat spreader 404 using Van der Waals bonds 412. In some examples, semiconductor active region 410 of gain chip can comprise a bulk semiconductor, heterostructure, one or more quantum wells, or one or more quantum dot layers. In some examples, semiconductor active region 410 can comprise GaAs, AlGaAs, InGaAs, InP, AlInGaAs, InGaAs, GaSb, AlGaAsSb, InGaAsSb, or GaAs,AlAs, AlGaAs, GaInP, AlGaInP. Semiconductor active region 410 is composed of a material having a refractive index denoted by $n_a$.

Broadband high-contrast grating 400 also comprises HGC 414 that is disposed on and bonded to a top surface of the gain chip using wafer bonding 416. The HCG 414 can be formed in any material transparent to the laser and, in some examples, a pump wavelength. HCG 414 is composed of a material having a refractive index denoted by $n_2$. As shown in FIG. 4, incident radiation, as shown by downward directed arrow, is provided to broadband high-contrast grating 400 from an environment with a refractive index denoted by $n_1$, which is 1 for air, and output radiation is shown by upward directed arrow. In the arrangement of FIG. 4, $n_2$ ($\sim n_a$) >$n_3$>$n_1$.

Figure 5:
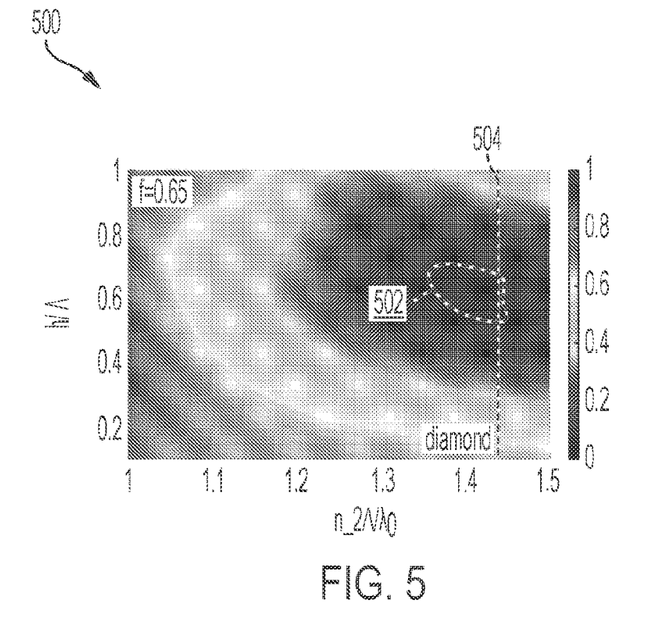
FIG. 5 shows a plot of HCG zero-order transmission as function of grating depth and period for a semi-infinite AlGaAs grating designed for 890 nm, the area outline by the dashed curve has <1% transmission into the zeroth diffraction order. The vertical dashed line represents the upper-limit of $n\Lambda/\lambda_0$ for achieving high reflectivity HCG on diamond substrate.

Unlike some of the designs of FIGS. 1-3, the active mirror design, e.g., HCG 916 of FIG. 9 can be formed directly on semiconductor active region 410 or gain chip 912, instead of using a separate material for the grating (e.g. silicon as proposed in [Iakovlev 2013]). To achieve high reflectivity from a HCG, the grating parameters (period $\Lambda$, fill factor f, etch depth h, index of refraction $n_2$) are chosen in a way to minimize the zero-order diffraction from the grating (i.e. light being transmitted straight through the grating, see FIG. 5). FIG. 5 shows a plot 500 of HCG zero-order transmission as function of grating depth and period for a semi-infinite AlGaAs grating designed for 890 nm, the area outline by the dashed curve 502 has <1% transmission into the zeroth diffraction order. The vertical dashed line 504 represents the upper-limit of $n_2\Lambda/\lambda_0$ for achieving high reflectivity HCG on diamond substrate. In addition, the higher diffraction orders (mostly +/−1) are at a large enough angle to allow for total internal reflection at the interface of the heat spreader (index of refraction $n_3$). The angle is sufficiently larger than the critical angle for total internal reflection. For a heat spreader with index $n_3$ and an active region with index $n_a$, the critical angle is given by arcsin ($n_3/n_a$) ($\sim$arcsin($n_3/n_2$)). Assuming a diamond heat spreader and GaAs active region, and a wavelength of 1000 nm, the critical angle is approximately 43°. In some examples, if the zero-order transmissions cannot be minimized sufficiently, the back surface of the heat spreader that is attached to the heat sink can be metalized using, for example, gold, silver, or other suitable metals, to reflect any zero-order transmissions back into the cavity with only a small loss.

Figure 6:
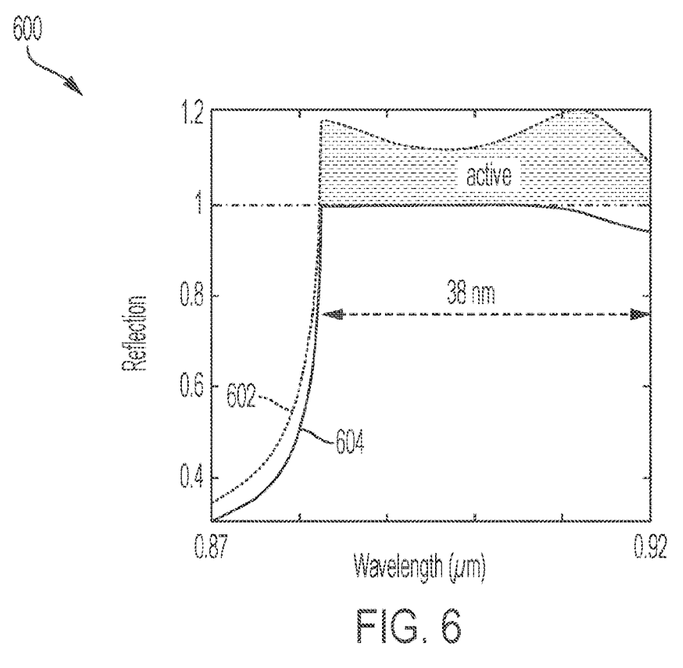
FIG. 6 shows a plot 600 of reflectivity spectrum for a HCG designed for 890 nm operation with constant material gain of 212 cm$^{-1}$, represented by line 602, and without gain, represented by line 604.

While passive HCGs with similar designs have been demonstrated before (as reflectors only), the design of FIGS. 4 and 9 are optimized to exhibit high reflectivity over a sufficiently broad wavelength range (FIG. 6), to allow for good overlap with the emission wavelength of the gain medium used. FIG. 6 shows a plot 600 of reflectivity spectrum for a HCG designed for 890 nm operation with constant material gain of 212 cm$^{-1}$, represented by line 602, and without gain, represented by line 604. This also makes the design more robust against small errors in the manufacturing process. Most importantly, we have discovered that by fine tuning the grating fill-factor, the high-reflectivity can be still achieved when bonded to a high refractive index heat spreader materials as most of the high thermal conductivity materials (e.g. diamond, silicon carbide, sapphire) have relatively high index of refraction.

Cavity design and thermal modeling: With an active region (e.g. heterostructure, quantum well(s), quantum dots) embedded underneath the HCG the semiconductor can be attached to the heat spreader. Since a good thermal contact is desirable, Van-der-Waals, or adhesive-free bonding [Cole 2017] is the preferred method to form this interface, but other techniques (including adhesives) are possible as well. Since the heat spreader is not part of the laser cavity, and only a small amount of the electric field penetrates it, the optical properties of the heat spreader are far less important compared to other designs, and lower quality (and cheaper) materials can be incorporated as well. The heat spreader in turn must be cooled as well, which could be achieved by direct contact with the cooling medium (e.g. via water jet impingement cooling [Albrecht 2011]), or by attaching it to a separate heat sink. Since most heat sink materials are not single-crystalline (e.g. poly-crystalline diamond, copper), adhesive-free bonding is typically not an option, so an intermediate material (e.g. thermal glue, indium) is needed to make good mechanical and thermal contact.

The active mirror assembly described above can be used in a standard VECSEL cavity (FIG. 1) without any changes. A variety of other linear, folded, or ring cavity geometries are possible as well.

Figure 7:
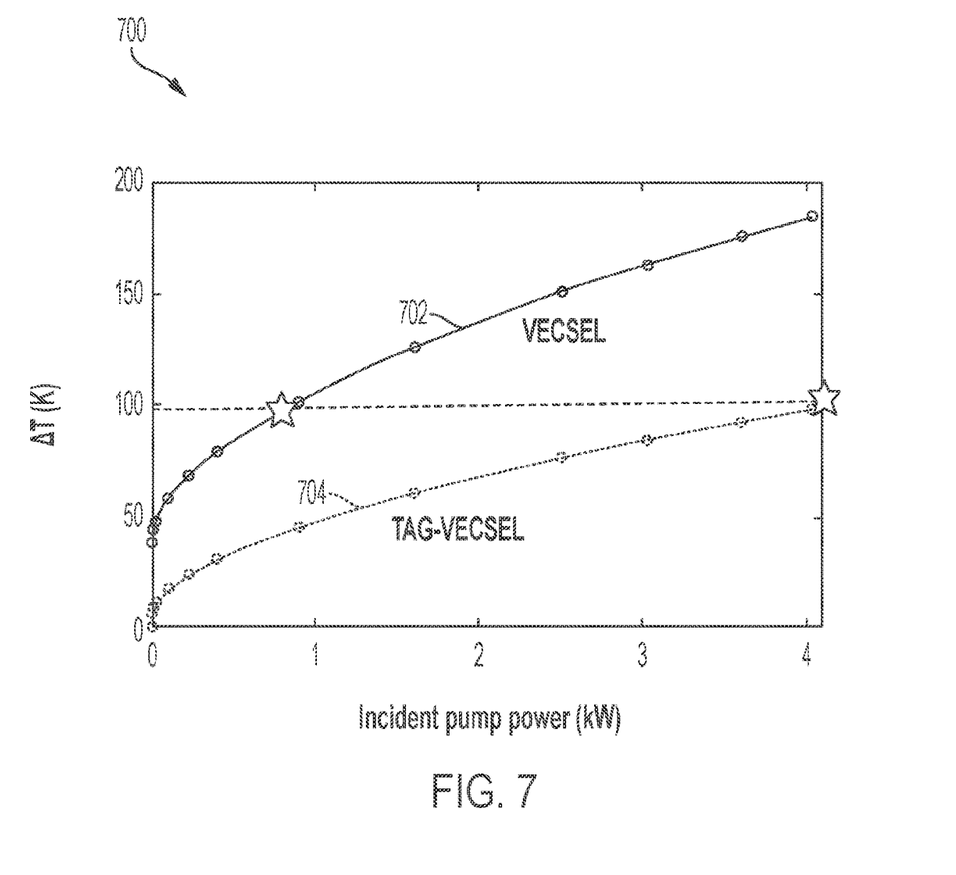
FIG. 7 shows a thermal modeling plot of active region temperature rise as function of incident pump power. The thermal modeling shows that the TAG-VECSEL structure outperforms standard VECSELs by nearly a factor of 5 in dissipated power assuming a maximum tolerated temperature increase of 100 degrees. This implies that kW (or multi-kW) semiconductor disk lasers can be finally realized.

One advantage of the present design over existing VECSELs lies in the reduced thermal resistance of the device. To investigate this, a detailed thermal modeling based on realistic device performance from literature [Kemp 2005] was performed. Keeping the pump intensity (pump power/pump spot area) constant, we increase the incident pump power and model the maximum temperature rise at the center of the active region. Laser output power is typically limited by thermal roll-over when the temperature rise in the active region approaches 100 degrees. FIG. 7 shows a thermal modeling plot 700 of active region temperature rise as function of incident pump power. The thermal modeling shows that the TAG-VECSEL structure outperforms standard VECSELs by nearly a factor of 5 in dissipated power assuming a maximum tolerated temperature increase of 100 degrees. This implies that kW (or multi-kW) semiconductor disk lasers can be finally realized. As can be seen in FIG. 7, in a typical VECSEL this occurs near 900 W of incident pump power, as represented by curve 702, while in the present grating-based active mirror design 4 kW of pump power can be tolerated, was represented by curve 704. This promises kW-level output powers from our devices, assuming efficiencies in line with current VECSEL performance.

Figure 8:
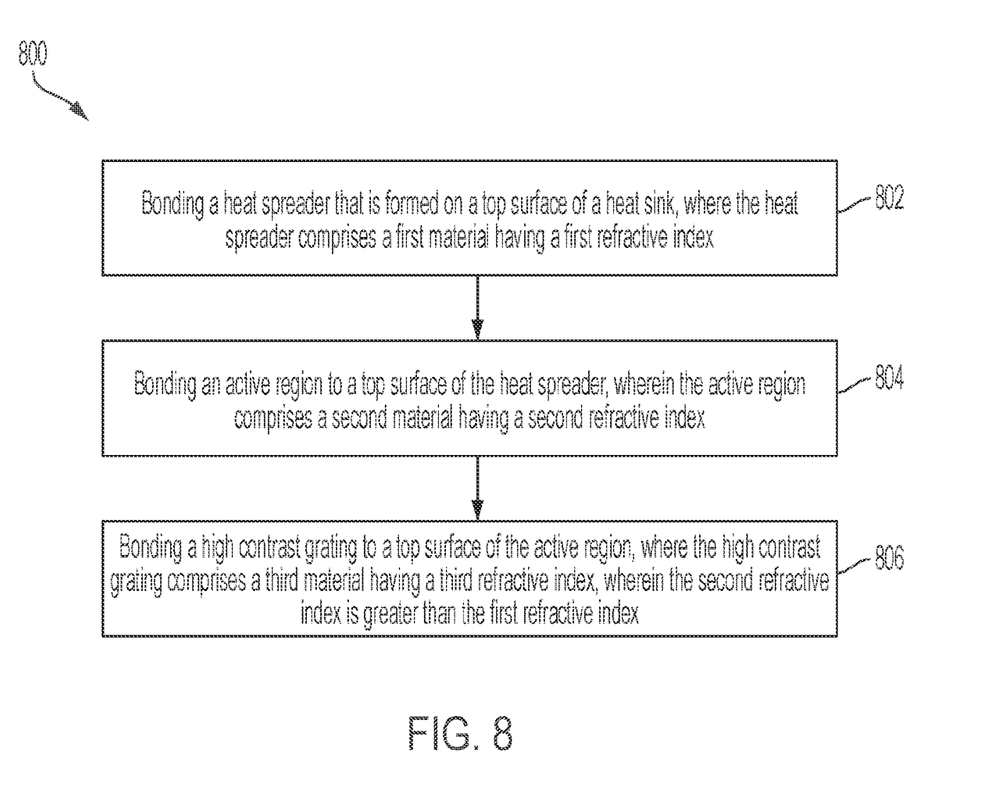
FIG. 8 shows a method of forming a vertical-external-cavity surface-emitting laser (VECSEL), according to examples of the present disclosure.

FIG. 8 shows a method 800 of forming a vertical-external-cavity surface-emitting laser (VECSEL), according to examples of the present disclosure. The method 800 comprises bonding, at 802, a heat spreader to a top surface of a heat sink, where the heat spreader comprises a first material having a first refractive index. The method 800 continues by bonding, at 804, bonding a semiconductor active region or a gain chip to a top surface of the heat spreader, wherein the semiconductor active region comprises a second material having a second refractive index. The method 800 continues by bonding and/or etching, at 806, a high contrast grating to a top surface of the semiconductor active region or a gain chip, wherein the high contrast grating comprises a third material having a third refractive index, wherein the second refractive index is greater than the first refractive index.

Notwithstanding that the numerical ranges and parameters setting forth the broad scope of the present teachings are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5. In certain cases, the numerical values as stated for the parameter can take on negative values. In this case, the example value of range stated as "less than 10" can assume negative values, e.g. −1, −2, −3, −10, −20, −30, etc.

While the present teachings have been illustrated with respect to one or more implementations, alterations and/or modifications can be made to the illustrated examples without departing from the spirit and scope of the appended claims. For example, it will be appreciated that while the process is described as a series of acts or events, the present teachings are not limited by the ordering of such acts or events. Some acts may occur in different orders and/or concurrently with other acts or events apart from those described herein. Also, not all process stages may be required to implement a methodology in accordance with one or more aspects or implementations of the present teachings. It will be appreciated that structural components and/or processing stages can be added or existing structural components and/or processing stages can be removed or modified. Further, one or more of the acts depicted herein may be carried out in one or more separate acts and/or phases. Furthermore, to the extent that the terms "including," "includes," "having," "has," "with," or variants thereof are used in either the detailed description and the claims, such terms are intended to be inclusive in a manner similar to the term "comprising." The term "at least one of" is used to mean one or more of the listed items can be selected. As used herein, the term "one or more of" with respect to a listing of items such as, for example, A and B, means A alone, B alone, or A and B. Further, in the discussion and claims herein, the term "on" used with respect to two materials, one "on" the other, means at least some contact between the materials, while "over" means the materials are in proximity, but possibly with one or more additional intervening materials such that contact is possible but not required. Neither "on" nor "over" implies any directionality as used herein. The term "about" indicates that the value listed may be somewhat altered, as long as the alteration does not result in nonconformance of the process or structure to the illustrated implementation. Finally, "exemplary" indicates the description is used as an example, rather than implying that it is an ideal. Other implementations of the present teachings will be apparent to those skilled in the art from consideration of the specification and practice of the disclosure herein. It is intended that the specification and examples be considered as exemplary only, with a true scope and spirit of the present teachings being indicated by the following claims.

What is claimed is:

1. A vertical-external-cavity surface-emitting laser (VECSEL) comprising:
   a heat sink;
   a heat spreader formed on a top surface of the heat sink, wherein the heat spreader comprises a first material having a first refractive index;
   a semiconductor active region formed on a top surface of the heat spreader, wherein the semiconductor active region comprises a second material having a second refractive index; and
   a high contrast grating formed on a top surface of the semiconductor active region, wherein the high contrast grating comprises a third material having a third refractive index, wherein a period, a fill factor, an etch depth, and an index of refraction of the high contrast grating are optimized such that a zero-order diffraction from the high contrast grating is minimized and higher diffraction orders transmitted to allow for total internal reflection at an interface of the heat spreader,
   wherein the second refractive index is greater than the first refractive index and a fourth refractive index, wherein the fourth refractive index represents a medium that a pump laser beam propagates through that is incident on the high contrast grating.

2. The VECSEL of claim 1, wherein the heat spreader is bonded to the heat sink using a thermal adhesive.

3. The VECSEL of claim 1, wherein the semiconductor active region is bonded to the heat spreader using Van der Waals bonding.

4. The VECSEL of claim 1, wherein the semiconductor active region comprises a gain chip.

5. The VECSEL of claim 1, wherein the semiconductor active region comprises GaAs, AlGaAs, InGaAs, InP/AlInGaAs/InGaAs, GaSb/AlGaAsSb/InGaAsSb, or GaAs/AlAs/AlGaAs/GaInP/AlGaInP.

6. The VECSEL of claim 1, wherein the heat spreader is diamond, silicon carbide, sapphire, or another high thermal conductivity, transparent heat spreader.

7. The VECSEL of claim 1, wherein the semiconductor active region comprises a bulk semiconductor, heterostructure, one or more quantum wells, or one or more quantum dot layers.

8. The VECSEL of claim 1, wherein the heat spreader is cooled by attachment to the heat sink.

9. The VECSEL of claim 8, wherein the heat spreader is bonded to the heat sink using a thermal glue, solder, or mechanical attachments.

10. A method of forming a vertical-external-cavity surface-emitting laser (VECSEL), the method comprising:

bonding a heat spreader to a top surface of a heat sink, where the heat spreader comprises a first material having a first refractive index;

bonding an active region to a top surface of the heat spreader, wherein the active region comprises a second material having a second refractive index; and forming a high contrast grating on a top surface of the active region, wherein the high contrast grating comprises a third material having a third refractive index, wherein the second refractive index is greater than the first refractive index and a fourth refractive index, wherein the fourth refractive index represents a medium that a pump laser beam propagates through that is incident on the high contrast grating, and wherein a period, a fill factor, an etch depth, and an index of refraction of the high contrast grating are optimized such that a zero-order diffraction from the high contrast grating is minimized and higher diffraction orders transmitted to allow for total internal reflection at an interface of the heat spreader.

11. The method of claim 10, wherein the heat spreader is bonded to the heat sink using a thermal adhesive.

12. The method of claim 10, wherein the active region is bonded to the heat spreader using Van der Waals bonding.

13. The method of claim 10, wherein the active region comprises a semiconductor active region.

14. The method of claim 10, wherein the active region comprises GaAs, AlGaAs, InGaAs, InP/AlInGaAs/InGaAs, GaSb/AlGaAsSb/InGaAsSb, or GaAs/AlAs/AlGaAs/GaInP/AlGaInP.

15. The method of claim 10, wherein the heat spreader is diamond, silicon carbide, sapphire, or another high thermal conductivity, transparent heat spreader.

16. The method of claim 10, wherein the active region comprises a bulk semiconductor, heterostructure, one or more quantum wells, or one or more quantum dot layers.

17. The method of claim 10, wherein the heat spreader is cooled by attachment to the heat sink.

18. The method of claim 17, wherein the heat spreader is bonded to the heat sink using a thermal glue, solder, or mechanical attachment.

19. A vertical-external-cavity surface-emitting laser (VECSEL) comprising:

a heat spreader, wherein the heat spreader comprises a first material having a first refractive index and wherein the heat spreader is cooled via direct contact with a cooling medium;

a semiconductor active region formed on a top surface of the heat spreader, wherein the semiconductor active region comprises a second material having a second refractive index; and a high contrast grating formed on a top surface of the semiconductor active region, wherein the high contrast grating comprises a third material having a third refractive index, wherein a period, a fill factor, an etch depth, and an index of refraction of the high contrast grating are optimized such that a zero-order diffraction from the high contrast grating is minimized and higher diffraction orders transmitted to allow for total internal reflection at an interface of the heat spreader, wherein the second refractive index is greater than the first refractive index and a fourth refractive index, wherein the fourth refractive index represents a medium that a pump laser beam propagates through that is incident on the high contrast grating.

* * * * *